United States Patent [19]
Chen et al.

[11] Patent Number: 6,066,532
[45] Date of Patent: May 23, 2000

[54] METHOD OF FABRICATING EMBEDDED GATE ELECTRODES

[75] Inventors: Chih-Rong Chen, Chu-Pei; Chi-Chin Yeh, Hsin-Chu, both of Taiwan

[73] Assignee: United Microelectronics Corp., Hsin-Chu, Taiwan

[21] Appl. No.: 09/419,434

[22] Filed: Oct. 18, 1999

[51] Int. Cl.[7] .................................................. H01L 21/336
[52] U.S. Cl. ........................ 438/259; 438/589; 438/305
[58] Field of Search .................................. 438/259, 299, 438/301, 303, 305, 306, 589, 595

[56] References Cited

U.S. PATENT DOCUMENTS

| | | | |
|---|---|---|---|
| 5,583,065 | 12/1996 | Miwa | 438/259 |
| 5,610,091 | 3/1997 | Cho | 438/259 |
| 5,668,031 | 9/1997 | Hsue et al. | 438/275 |
| 5,998,288 | 12/1999 | Gardner et al. | 438/589 |

*Primary Examiner*—Charles Bowers
*Assistant Examiner*—Jack Chen
*Attorney, Agent, or Firm*—Harness, Dickey & Pierce, P.L.C.

[57] ABSTRACT

A method of fabricating an embedded gate electrode is disclosed. The method includes the steps of: Providing a semiconductor substrate; forming a patterned etch resistant mask layer over the semiconductor substrate, wherein the patterned etch resistant mask layer has a first opening for a desired location of a trench; anisotropically etching through the patterned etch resistant mask layer and into the semiconductor substrate, hence forming the trench at the desired location; removing the patterned etch resistant mask layer; depositing a first insulating layer over the semiconductor substrate and filling up the trench; patterning a planarized first insulating layer to define a second opening for the embedded gate electrode; forming a second insulating layer at the bottom of the second opening; depositing a conductive layer over the second insulating layer and filling up the second opening, hence forming the embedded gate electrode; ion implanting the semiconductor substrate to form source/drain regions; forming a spacer on the sidewall of the embedded gate electrode; depositing a refractory metal layer over the entire exposing surface of a resulting structure; and annealing the refractory metal layer to form a silicide layer on the embedded gate electrode and elsewhere on the source/drain regions.

53 Claims, 6 Drawing Sheets

METHOD OF FABRICATING EMBEDDED GATE ELECTRODES

BACKGROUND OF THE INVENTION

1. Field of the Invention

The present invention relates in general to integrated circuit devices, and in particular to a method of fabricating an embedded gate electrode for solving the problem of making the tradeoff between junction depth and silicide thickness.

2. Description of the Prior Art

In process for fabricating semiconductor components, as the features of VLSI circuits continue to shrink to 0.5 μm and below, the necessity of decreasing the resistance and capacitance (RC) associated with interconnection paths becomes even more pressing. This is particularly true for MOS devices, in which the RC delay due to the interconnect paths can exceed the delays due to gate switching. The higher the value of the interconnect R (resistance)×C (capacitance) product, the more likely is the circuit operating speed to be limited by this delay. The conclusion is that low resistivity interconnection paths are critical in order to fabricate dense, high performance devices.

There are several potential approaches to reduce the resistivity of the interconnect to less than 10–15 Ω/sq exhibited by polysilicon. The most widespread approach used in the IC industry is the fabricating application of self-aligned silicide (salicide). Salicide processes are commonly employed to provide a metal silicide layer over the polysilicon gate electrode and over the source/drain regions of the silicon substrate, to facilitate electrically and metallurgically connecting the silicon to metal interconnects. A salicide process normally comprises the following steps. Firstly, a MOS transistor having a gate, source/drain regions, and spacers are formed above a silicon substrate. Secondly, a metallic layer with a thickness of about 200 angstroms to 1000 angstroms is then deposited on the surface of the silicon substrate through a magnetron DC sputtering method. Thirdly, upon application of a high temperature, part of the metallic layer reacts with silicon above the source/drain regions and polysilicon above the gate of the MOS transistor, thereby forming silicide layers. Finally, unreacted residual metal remaining after the reactive process is then removed by a wet etching method, thereby leaving behind the metal silicide layer on the top surfaces of the MOS terminals. Most commonly used materials for the salicide processes are titanium (Ti), cobalt (Co), nickel (Ni), platinum (Pt), tungsten (W), molybdenum (Mo), and copper (Cu).

Since the silicide formation consumes part of the source/drain regions, the source/drain regions must be deep enough to prevent spiking of the silicide through the diode junctions, since this would cause junction leakage and lower transistor performance. Deeper junctions in turn also lead to lower transistor performance due to parasitic capacitance and inhibited scalability of the gate length. Thus, a tradeoff must normally be made between junction depth and silicide thickness, since shallower junctions are incompatible with thicker silicide layers.

Heretofore, attempts to form shallow junctions with a thick silicide cover have been less than satisfactory. One such method is referred to as ion-implantation through metal (ITM). In ITM, a metal layer is applied to the silicon surface which will be subsequently doped. Ion-implantation is then conducted through the metal and into the silicon to form the doped region. Silicide is then formed over the doped region by a standard annealing process such as a furnace anneal or a rapid thermal anneal. Unfortunately, to meet the dual objectives of a shallow junction and a thick silicide layer, metal must be deposited to a typical thickness of at least 1,000 Angstroms. Implanting a dopant through a metal layer of 1,000 Angstroms requires high implant energy which can damage the surface of the metal layer and create defects (spiking) by driving some of the metal atoms into the silicon substrate.

An alternative to ITM is to apply a metal layer to the silicon surface which is to be doped and subsequently to implant dopants into the metal rather than through the metal. However, the use of a thick metal layer to meet the objective of a low resistivity silicide layer still requires high implant energy at which to implant dopants.

The above problems need to be addressed if integrated circuits with improved electrical performance and reliable manufacturing processes are to be achieved. Therefore, alternate techniques for solving the problem of making the tradeoff between junction depth and silicide thickness are desired. Thus, a method of fabricating embedded gate electrodes in avoiding junction leakage is introduced into shallow junction processes by the present invention.

SUMMARY OF THE INVENTION

An object of the present invention is to guarantee an appropriate thickness of suicides been formed for avoiding discontinuous formations of island-like suicides.

Another object of the present invention is to make sure the depth of silicon loss plus the silicide thickness is obviously less than the junction depth. Hence, the problem of junction leakage due to the formations of thick silicide in shallow junctions is solved and the transistor performance is improved.

A further object of the present invention is to form gate electrodes having uniform sidewall profile and spacers within trenches, where the planarization of interlayer dielectric (ILD) will be much easier than the usual stacked gate electrode cases.

In accordance with the present invention, a method is provided for forming an embedded gate electrode that substantially solves the problem of making the tradeoff between junction depth and silicide thickness. In one embodiment of the present invention, the method includes the steps of: Providing a semiconductor substrate; forming a patterned etch resistant mask layer over the semiconductor substrate, wherein the patterned etch resistant mask layer has a first opening for a desired location of a trench; anisotropically etching through the patterned etch resistant mask layer and into the semiconductor substrate, hence forming the trench at the desired location; removing the patterned etch resistant mask layer; depositing a first insulating layer over the semiconductor substrate and filling up the trench; planarizing the first insulating layer; patterning the planarized insulating layer to define a second opening for the embedded gate electrode at the desired location; forming a second insulating layer at the bottom of the second opening; depositing a conductive layer over the second insulating layer and filling up the second opening, hence forming the embedded gate electrode; ion implanting the semiconductor substrate to form source/drain regions; removing a portion of the planarized and patterned insulating layer, thus leaving a spacer on the sidewall of the embedded gate electrode; depositing a refractory metal layer over the entire exposing surface of a resulting structure; annealing the refractory metal layer to form a silicide layer on the embedded gate electrode and elsewhere on the source/drain regions; and removing unreacted refractory metal and refractory metal reaction product other than silicide.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1A to FIG. 1K depicts the process flow of a preferred embodiment according to the present invention in cross-sectional views.

DESCRIPTION OF THE PREFERRED EMBODIMENT

Referring to FIG. 1A–1K, the process flow of a preferred embodiment according to the present invention is depicted in cross-sectional views. These drawings merely show several key steps in sequential processes.

Figure 1A:
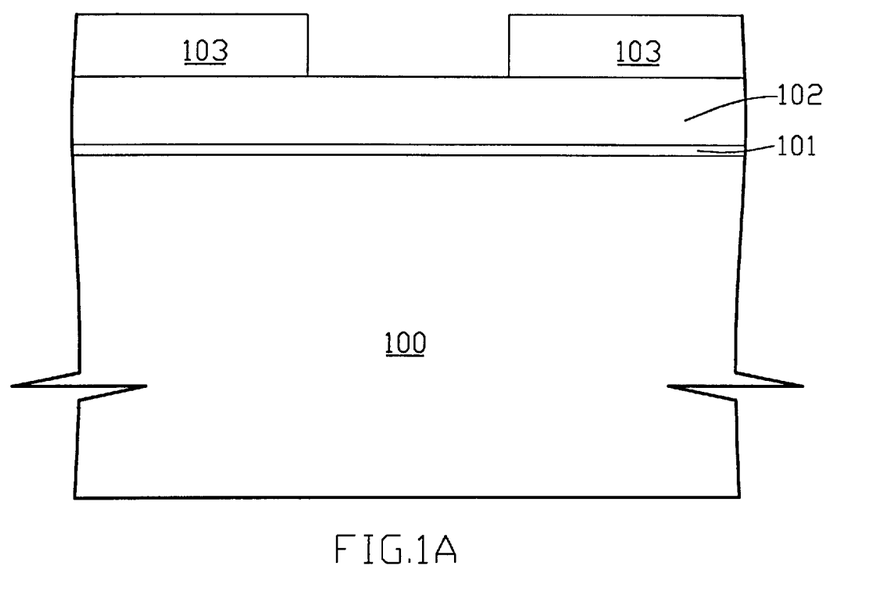
Figure 1B:
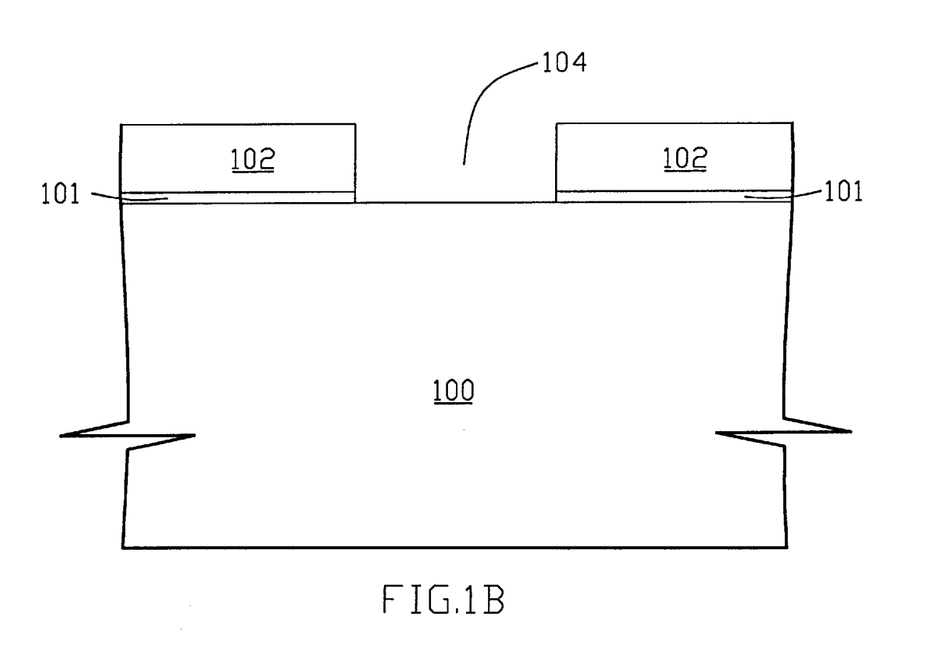

The present invention will be described by reference to the particular embodiment of the present invention. In accordance with FIG. 1A, the method starts by depositing a thermally oxidized silicon dioxide ($SiO_2$) layer (pad oxide) 101 over a silicon semiconductor substrate 100. The pad oxide layer 101 has a thickness of about 200 to 500 angstroms. A silicon nitride ($Si_3N_4$) layer 102 is formed over the pad oxide layer 101 by low pressure chemical vapor deposition (LPCVD) to a thickness of about 1000 to 2000 angstroms. A conventional photolithographic technique is then applied by having a first photo mask 103 formed over the silicon nitride layer 102. The silicon nitride layer 102 and the pad oxide layer 101 are selectively etched and the first photo mask is then removed, thus forming a patterned etch resistant mask layer over the silicon semiconductor substrate 100, wherein the patterned etch resistant mask layer has a first opening 104 for a desired location of a trench, as referring to what is shown in FIG. 1B. The etchant used in selectively etching the silicon nitride layer 102 comprises hot phosphoric acid ($H_3PO_4$) and the etchant used in selectively etching the pad oxide layer 101 comprises buffered hydrofluoric acid (HF).

Figure 1C:
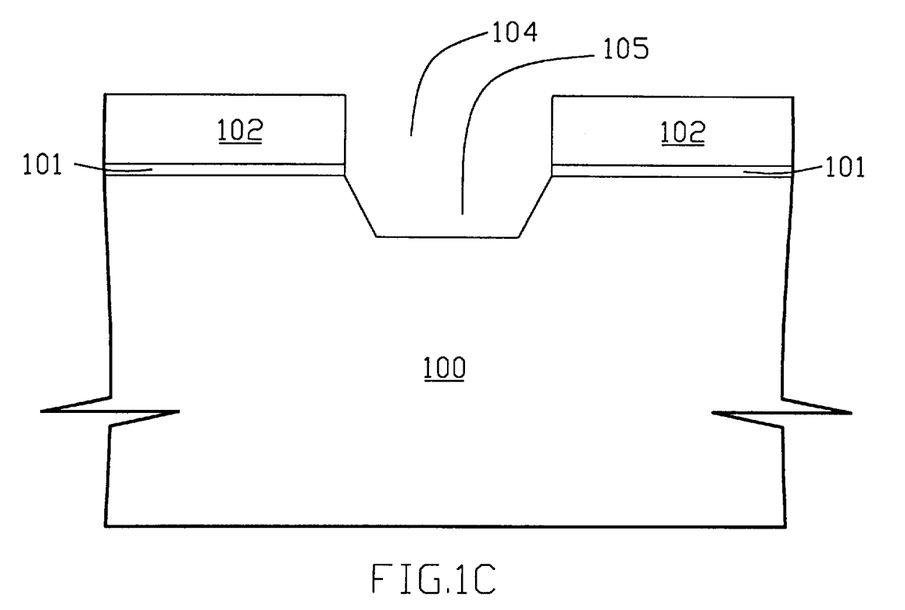
Figure 1D:
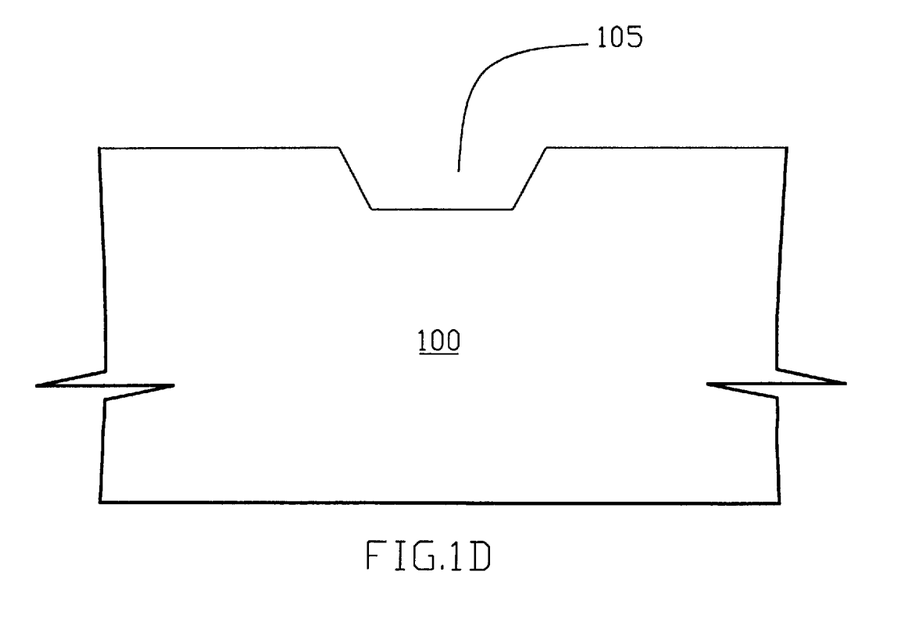

Now referring to FIG. 1C, the properties of Orientation Dependent Etching are utilized in the formation of the trench. The silicon semiconductor substrate 100 has its major surfaces lying substantially in the "100" plane and internal "111" planes at an angle for silicon of 54.7.degree to the "100" planes. Openings are formed in the silicon wafer using an anisotropic etchant which works much more normally to the "100" plane than it does laterally or parallel to the "100" plane. Hence, the etchant works less in the "111" planes to thereby leave a terrace-like trench 105 in the silicon semiconductor substrate 100. The anisotropic etchant normally comprises potassium hydroxide (KOH), water ($H_2O$) and isopropyl alcohol. The location of the opening is determined by the patterned etch resistant mask layer with the first opening 104 through which the etchant can attack the 100 planes. The depth of the opening if etched to termination (i.e., when all exposed 100 planes are removed) is generally a function of the size of the first opening 104 and the etching time period. The patterned etch resistant mask layer is then removed, that is, removing the silicon nitride layer and the pad oxide layer, leaving only the terrace-like trench 105 in the silicon semiconductor substrate 100, as shown in FIG. 1D, where the bottom depth of the terrace-like trench 105 is greater than about 300 angstroms.

Figure 1E:
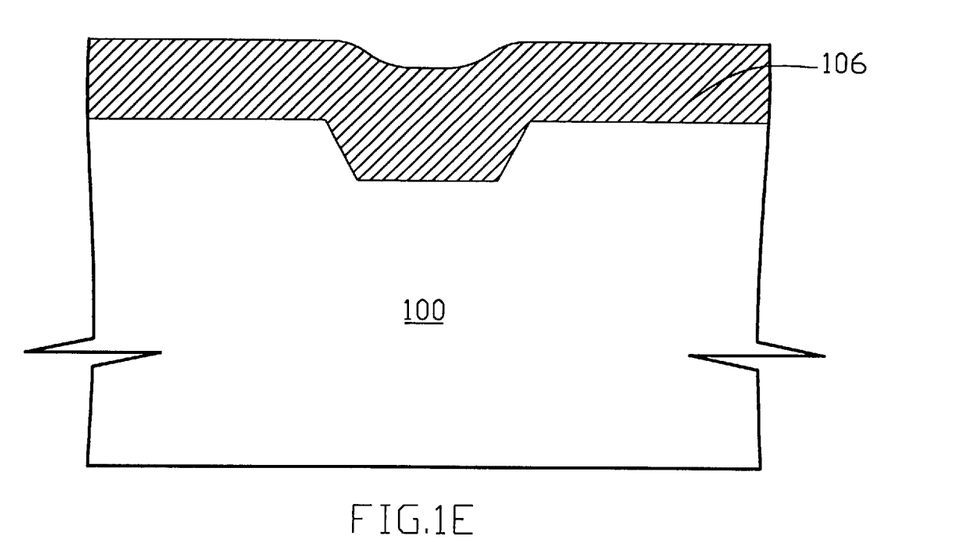
Figure 1F:
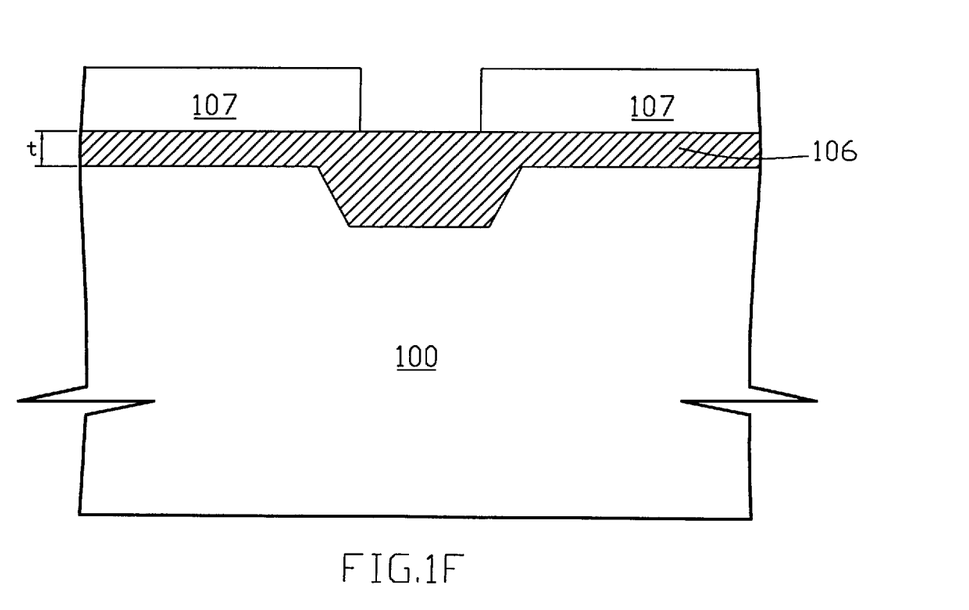
Figure 1G:
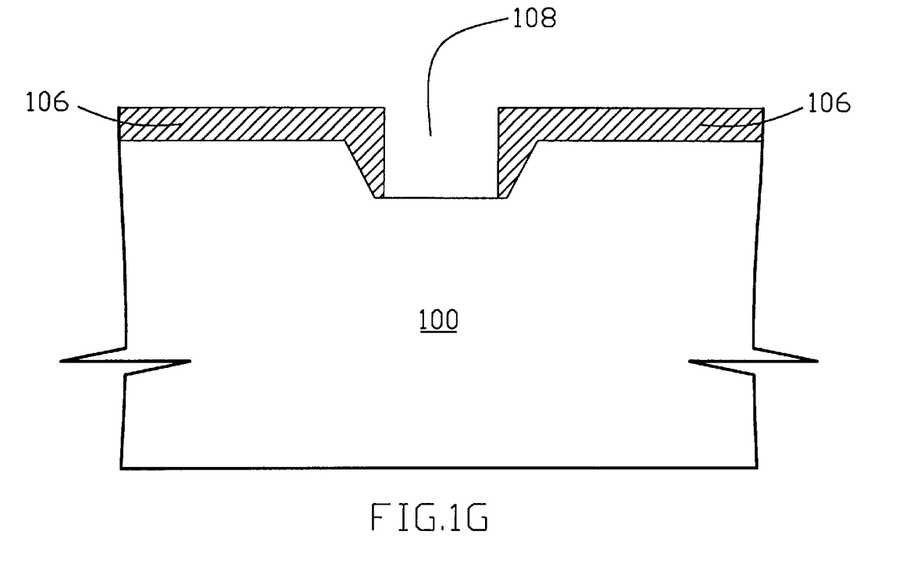

In FIG. 1E, an insulating layer 106 is deposited by low pressure chemical vapor deposition over the silicon semiconductor substrate 100 and fills up the terrace-like trench. The insulating layer 106 is formed for the purpose of spacer formation in later stages, wherein the spacer material can either be silicon dioxide or silicon nitride. The insulating layer 106 is later planarized by chemical mechanical polishing (CMP) to a height t (shown in FIG. 1F) above the surface of the silicon semiconductor substrate 100, where the height t is in the range of about 0 to 1000 angstroms. The height t is assumed to be greater than 0 angstrom for the present embodiment. FIG. 1F and 1G show another photolithographic process been carried out, where a second photo mask 107 is formed over the planarized insulating layer 106 and the insulating layer is patterned to define a second opening 108 for an embedded gate electrode formation at the desired location, wherein the second opening is smaller than the first opening.

Figure 1H:
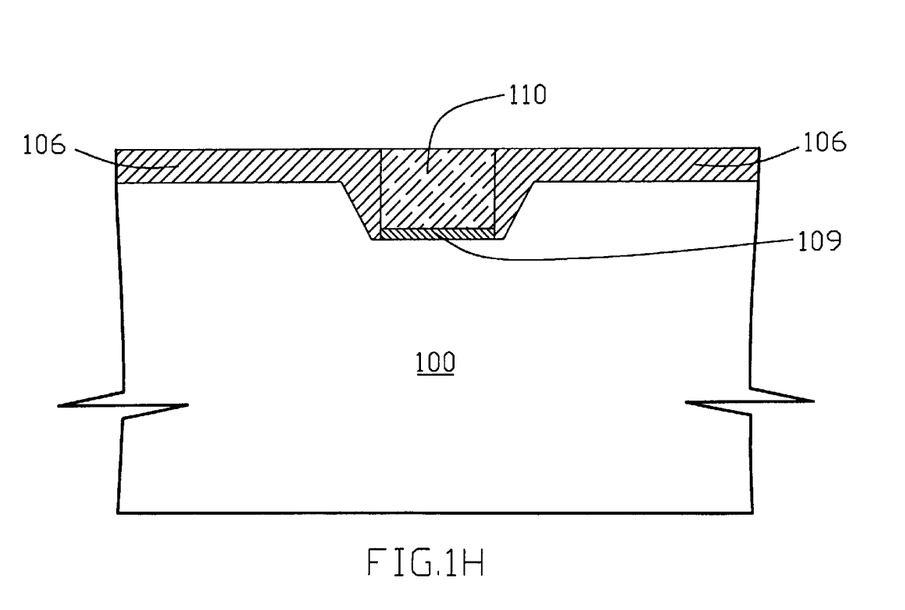

Next, in FIG. 1H, a gate oxide layer 109, preferably silicon dioxide ($SiO_2$), is formed on the silicon semiconductor substrate 100 and at the bottom of the second opening. The gate oxide layer 109 is formed by either dry oxidation or wet oxidation to a thickness of about 100 to 250 angstroms. A blanket polysilicon layer 110 is then deposited over the gate oxide layer 109, filled up the second opening and elsewhere over the insulating layer 106 (not shown in FIG. 1H). The polysilicon layer 110 is formed by low pressure chemical vapor deposition (LPCVD) and then planarized by chemical mechanical polishing, hence forming the embedded gate electrode.

Figure 1I:
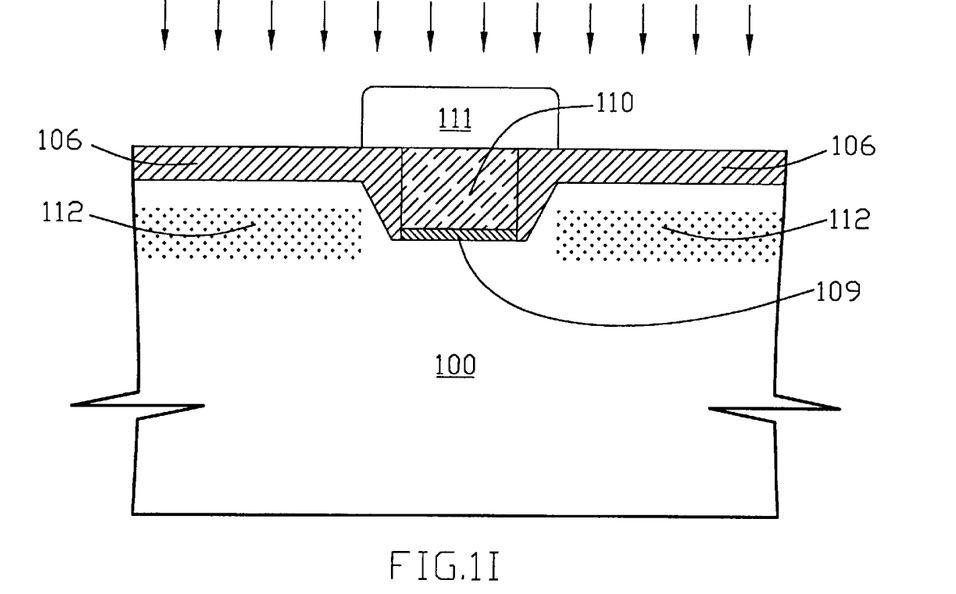

In FIG. 1I, a third photo mask 111 is formed over the silicon semiconductor substrate 100, in particular covering the embedded gate electrode. The silicon semiconductor substrate 100 is then ion implanted through the third photo mask 111 to form source/drain regions 112, wherein the source/drain regions 112 have a bottom depth which is about 500 to 1000 angstroms deeper than the bottom depth of the terrace-like trench inside the silicon semiconductor substrate 100. Moreover, the ion source for ion implanting the silicon semiconductor substrate can either be phosphorus (P) or arsenic (As) or any other N-type ions. The third photo mask is then removed after the formation of the source/drain regions.

Figure 1J:
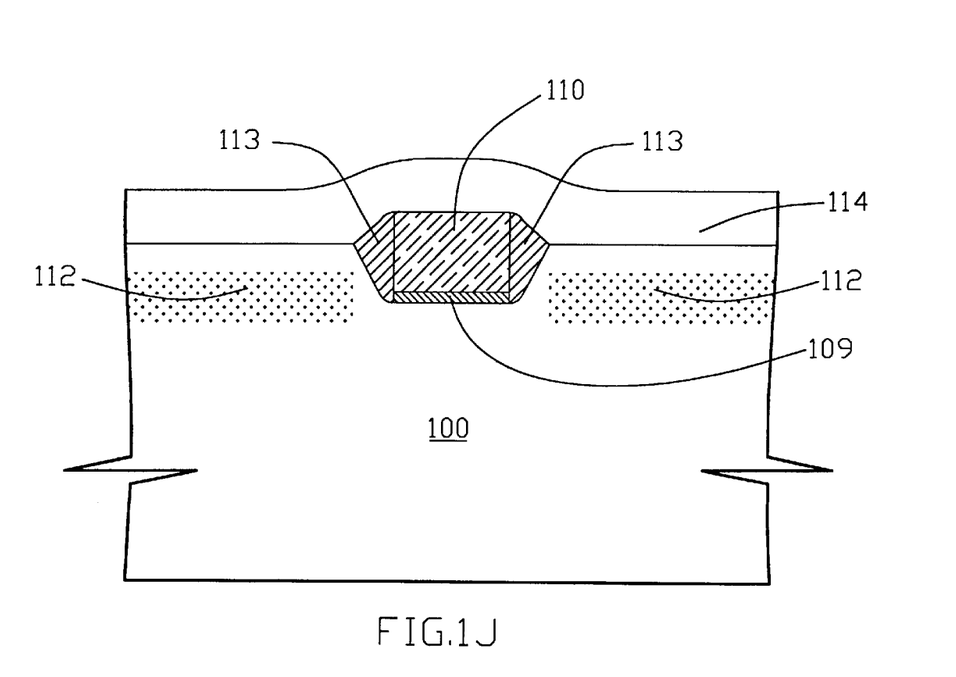
Figure 1K:
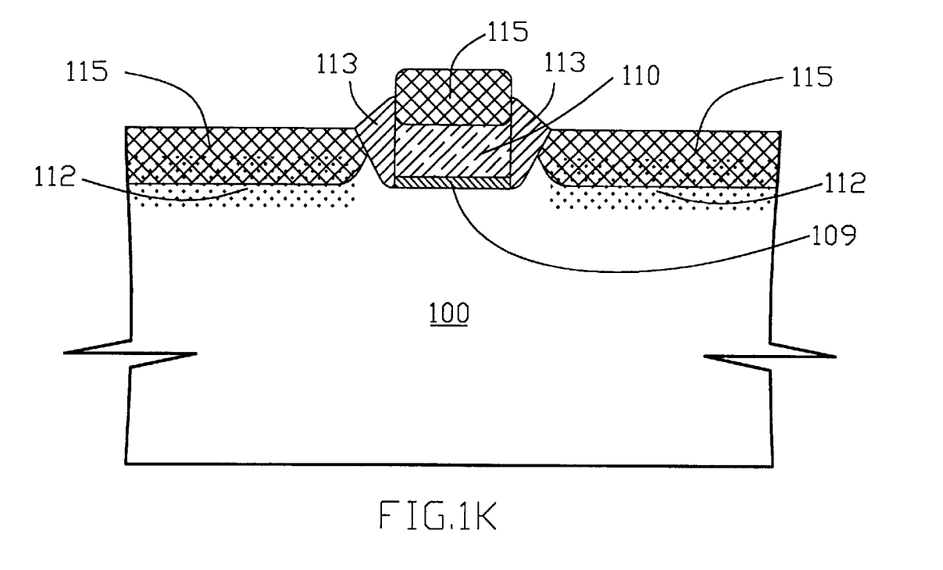

Consequentially, a portion of the planarized and patterned insulating layer is removed, thus leaving a spacer 113 formed on the sidewall of the embedded gate electrode, as shown in FIG. 1J. Nevertheless, the step of removing a portion of the planarized and patterned insulating layer can be skipped if the height t (as shown in FIG. 1F) equals to 0 angstrom. A conformal refractory metal layer 114 having a thickness ranging from about 200 angstroms to about 500 angstroms is formed over the entire exposing surface of the resulting structure at this point in the process. The refractory metal, such as titanium (Ti), cobalt (Co), nickel (Ni), platinum (Pt), tungsten (W), molybdenum (Mo), or copper (Cu) is formed by using one of the conventional techniques such as magnetron DC sputtering, electron beam evaporation, or chemical vapor deposition.

Finally, after the refractory metal layer is formed over the silicon semiconductor substrate, the silicon semiconductor substrate is then annealed by rapid thermal processing at a temperature ranging from about 400°C. to about 950°C. The semiconductor substrate is kept in an essentially oxygen free environment until after the annealing step. The temperature at which the substrate is annealed is largely a matter of design choice. The semiconductor substrate is annealed for an amount of time that is sufficient to convert the refractory metal to metal silicide. Although not illustrated in FIG. 1K, unreacted metal and metal reaction products other than metal silicide are removed by using a chemical cleaning solution, which comprises sulfuric-peroxide mix (SPM, $H_2SO_4/H_2O_2$), from the substrate at this point in the process. After this annealing step, a metal silicide layer 115 having a thickness of about 500 angstroms is formed directly over the embedded gate electrode and elsewhere on the source/drain regions 112.

Although specific embodiments have been illustrated and described, it will be obvious to those skilled in the art that various modifications may be made without departing from what is intended to be limited solely by the appended claims.

What is claimed is:

1. A method of fabricating an embedded gate electrode, comprising the steps of:

providing a semiconductor substrate;

forming a patterned etch resistant mask layer over said semiconductor substrate, wherein said patterned etch resistant mask layer has a first opening for a location of a trench;

anisotropically etching through said patterned etch resistant mask layer and into said semiconductor substrate for a time period, hence forming said trench at said location;

removing said patterned etch resistant mask layer;

depositing a first insulating layer over said semiconductor substrate and filling up said trench;

planarizing said first insulating layer to a height above a surface of said semiconductor substrate;

patterning said planarized first insulating layer to define a second opening for said embedded gate electrode at said location, said second opening is smaller than said first opening;

forming a second insulating layer at a bottom of said second opening;

depositing a conductive layer over said second insulating layer and filling up said second opening, hence forming said embedded gate electrode;

ion implanting said semiconductor substrate through a first photo mask to form source/drain regions having a first bottom depth deeper than a second bottom depth of said trench inside said semiconductor substrate;

removing and patterning a portion of said planarized first insulating layer as well as said first photo mask, thus leaving a spacer on a sidewall of said embedded gate electrode;

depositing a refractory metal layer over an entire exposing surface of a resulting structure;

annealing said refractory metal layer to form a silicide layer on said embedded gate electrode and elsewhere on said source/drain regions; and removing an unreacted refractory metal layer and a refractory metal reaction product other than silicide.

2. The method in accordance with claim 1, wherein said patterned etch resistant mask layer comprises a thermally grown silicon dioxide layer and a silicon nitride layer over said thermally grown silicon dioxide layer.

3. The method in accordance with claim 2, wherein said thermally grown silicon dioxide layer has a thickness of about 200 to 500 angstroms.

4. The method in accordance with claim 2, wherein said silicon nitride layer is formed by low pressure chemical vapor deposition to a thickness of about 1000 to 2000 angstroms.

5. The method in accordance with claim 2, wherein forming said patterned etch resistant mask layer comprises:

forming a second photo mask over said silicon nitride layer;

selectively etching said silicon nitride layer;

selectively etching said thermally grown silicon dioxide layer, hence forming said first opening; and removing said second photo mask.

6. The method in accordance with claim 5, wherein an etchant used in selectively etching said silicon nitride layer comprises hot phosphoric acid ($H_3PO_4$).

7. The method in accordance with claim 5, wherein an etchant used in selectively etching said thermally grown silicon dioxide layer comprises buffered hydrofluoric acid (HF).

8. The method in accordance with claim 1, wherein an etchant used in anisotropically etching through said patterned etch resistant mask layer and into said semiconductor substrate comprises potassium hydroxide (KOH), water ($H_2O$) and isopropyl alcohol.

9. The method in accordance with claim 1, wherein said second bottom depth of said trench is greater than about 300 angstroms.

10. The method in accordance with claim 9, wherein said second bottom depth is controlled by said time period, where a longer the time period the deeper the depth of said trench.

11. The method in accordance with claim 1, wherein said source/drain regions having said first bottom depth is about 500 to 1000 angstroms deeper than said second bottom depth of said trench inside said semiconductor substrate.

12. The method in accordance with claim 1, wherein said first insulating layer comprises silicon dioxide and is deposited by low pressure chemical vapor deposition.

13. The method in accordance with claim 1, wherein planarizing said first insulating layer is accomplished by chemical mechanical polishing.

14. The method in accordance with claim 1, wherein said height above the surface of said semiconductor substrate is in the range of about 0 to 1000 angstroms.

15. The method in accordance with claim 1, wherein said second insulating layer comprises silicon dioxide and is formed by dry oxidation method to a thickness of about 100 to 250 angstroms.

16. The method in accordance with claim 1, wherein said second insulating layer comprises silicon dioxide and is formed by wet oxidation method to a thickness of about 100 to 250 angstroms.

17. The method in accordance with claim 1, wherein said conductive layer comprises polysilicon.

18. The method in accordance with claim 1, wherein an ion source for ion implanting said semiconductor substrate comprises phosphorus (P).

19. The method in accordance with claim 1, wherein an ion source for ion implanting said semiconductor substrate comprises arsenic (As).

20. The method in accordance with claim 1, wherein said refractory metal layer comprises cobalt (Co).

21. The method in accordance with claim 1, wherein said refractory metal layer comprises titanium (Ti).

22. The method in accordance with claim 1, wherein said refractory metal layer comprises platinum (Pt).

23. The method in accordance with claim 1, wherein said refractory metal layer is formed by magnetron DC sputtering to a thickness ranging from about 200 to about 500 angstroms.

24. The method in accordance with claim 1, wherein said refractory metal layer is formed by electron beam evaporation to a thickness ranging from about 200 to about 500 angstroms.

25. The method in accordance with claim 1, wherein said refractory metal layer is formed by chemical vapor deposition to a thickness ranging from about 200 to about 500 angstroms.

26. The method in accordance with claim 1, wherein annealing said refractory metal layer is carried out by rapid thermal processing at a temperature ranging from about 400° C. to about 950° C.

27. The method in accordance with claim 1, wherein said silicide layer has a thickness of about 500 angstroms.

28. The method in accordance with claim 1, wherein removing said unreacted refractory metal layer and said refractory metal reaction product other than silicide is accomplished by using a chemical cleaning solution which comprises sulfuric-peroxide mix (SPM, $H_2SO_4/H_2O_2$).

29. A method of fabricating an embedded gate electrode, comprising the steps of:

providing a silicon semiconductor substrate;

depositing a pad oxide layer over said silicon semiconductor substrate;

depositing a silicon nitride layer over said pad oxide layer;

forming a first photo mask over said silicon nitride layer;

selectively etching said silicon nitride layer and said pad oxide layer, hence forming a patterned etch resistant mask layer over said silicon semiconductor substrate, wherein said patterned etch resistant mask layer has a first opening for a location of a trench;

removing said first photo mask;

anisotropically etching through said patterned etch resistant mask layer and into said silicon semiconductor substrate for a time period, hence forming said trench at said location;

removing said patterned etch resistant mask layer, that is, removing said silicon nitride layer and said pad oxide layer;

depositing an insulating layer over said silicon semiconductor substrate and filling up said trench;

planarizing said insulating layer to a height above a surface of said silicon semiconductor substrate;

patterning said planarized insulating layer to define a second opening for said embedded gate electrode at said location, said second opening is smaller than said first opening;

forming a gate oxide layer at a bottom of said second opening;

depositing a blanket polysilicon layer over an entire exposing surface of a resulting structure at this point in the process and filling up said second opening;

planarizing said polysilicon layer to form said embedded gate electrode;

forming a second photo mask over said silicon semiconductor substrate;

ion implanting said silicon semiconductor substrate through said second photo mask to form source/drain regions having a first bottom depth deeper than a second bottom depth of said trench inside said silicon semiconductor substrate;

removing and patterning a portion of said planarized insulating layer as well as said second photo mask, thus leaving a spacer on a sidewall of said embedded gate electrode;

depositing a conformal refractory metal layer over an entire exposing surface of a resulting structure at this point in the process;

annealing said refractory metal layer to form a silicide layer on said embedded gate electrode and elsewhere on said source/drain regions; and removing an unreacted refractory metal layer and a refractory metal reaction product other than silicide.

30. The method in accordance with claim 29, wherein said pad oxide layer has a thickness of about 200 to 500 angstroms.

31. The method in accordance with claim 29, wherein said silicon nitride layer is formed by low pressure chemical vapor deposition to a thickness of about 1000 to 2000 angstroms.

32. The method in accordance with claim 29, wherein an etchant used in selectively etching said silicon nitride layer comprises hot phosphoric acid ($H_3PO_4$).

33. The method in accordance with claim 29, wherein an etchant used in selectively etching said pad oxide layer comprises buffered hydrofluoric acid (HF).

34. The method in accordance with claim 29, wherein an etchant used in anisotropically etching through said patterned etch resistant mask layer and into said silicon semiconductor substrate comprises potassium hydroxide (KOH), water ($H_2O$) and isopropyl alcohol.

35. The method in accordance with claim 29, wherein said second bottom depth of said trench is greater than about 300 angstroms.

36. The method in accordance with claim 29, wherein said second bottom depth is controlled by said time period, where a longer the time period the deeper the depth of said trench.

37. The method in accordance with claim 29, wherein said source/drain regions having said first bottom depth is about 500 to 1000 angstroms deeper than said second bottom depth of said trench inside said silicon semiconductor substrate.

38. The method in accordance with claim 29, wherein said insulating layer comprises silicon dioxide and is deposited by low pressure chemical vapor deposition.

39. The method in accordance with claim 29, wherein planarizing said insulating layer is accomplished by chemical mechanical polishing.

40. The method in accordance with claim 29, wherein said height above the surface of said silicon semiconductor substrate is in the range of about 0 to 1000 angstroms.

41. The method in accordance with claim 29, wherein said gate oxide layer comprises silicon dioxide and is formed by dry oxidation method to a thickness of about 100 to 250 angstroms.

42. The method in accordance with claim 29, wherein said gate oxide layer comprises silicon dioxide and is formed by wet oxidation method to a thickness of about 100 to 250 angstroms.

43. The method in accordance with claim 29, wherein an ion source for ion implanting said silicon semiconductor substrate comprises phosphorus (P).

44. The method in accordance with claim 29, wherein an ion source for ion implanting said silicon semiconductor substrate comprises arsenic (As).

45. The method in accordance with claim 29, wherein said refractory metal layer comprises cobalt (Co).

46. The method in accordance with claim 29, wherein said refractory metal layer comprises titanium (Ti).

47. The method in accordance with claim 29, wherein said refractory metal layer comprises platinum (Pt).

48. The method in accordance with claim 29, wherein said refractory metal layer is formed by magnetron DC sputtering to a thickness ranging from about 200 to about 500 angstroms.

49. The method in accordance with claim 29, wherein said refractory metal layer is formed by electron beam evaporation to a thickness ranging from about 200 to about 500 angstroms.

50. The method in accordance with claim 29, wherein said refractory metal layer is formed by chemical vapor deposition to a thickness ranging from about 200 to about 500 angstroms.

51. The method in accordance with claim 29, wherein annealing said refractory metal layer is carried out by rapid thermal processing at a temperature ranging from about 400° C. to about 950° C.

52. The method in accordance with claim 29, wherein said silicide layer has a thickness of about 500 angstroms.

53. The method in accordance with claim 29, wherein removing said unreacted refractory metal layer and said refractory metal reaction product other than silicide is accomplished by using a chemical cleaning solution which comprises sulfuric-peroxide mix (SPM, $H_2SO_4/H_2O_2$).

* * * * *